(12) United States Patent
Hoffmann et al.

(10) Patent No.: US 8,735,987 B1
(45) Date of Patent: May 27, 2014

(54) CMOS GATE STACK STRUCTURES AND PROCESSES

(75) Inventors: Thomas Hoffmann, Los Gatos, CA (US); Scott E. Thompson, Gainesville, FL (US); Pushkar Ranade, Los Gatos, CA (US)

(73) Assignee: Suvolta, Inc., Los Gatos, CA (US)

( * ) Notice: Subject to any disclaimer, the term of this patent is extended or adjusted under 35 U.S.C. 154(b) by 0 days.

(21) Appl. No.: 13/489,824

(22) Filed: Jun. 6, 2012

Related U.S. Application Data

(60) Provisional application No. 61/493,646, filed on Jun. 6, 2011.

(51) Int. Cl.
*H01L 27/092* (2006.01)

(52) U.S. Cl.
USPC .......................................................... 257/369

(58) Field of Classification Search
USPC ............................ 257/369, 372; 438/199, 217
See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |

(Continued)

FOREIGN PATENT DOCUMENTS

| | | |
|---|---|---|
| EP | 0274278 | 7/1988 |
| EP | 0312237 | 4/1989 |

(Continued)

OTHER PUBLICATIONS

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

(Continued)

*Primary Examiner* — Matthew W Such
*Assistant Examiner* — Warren H Kilpatrick
(74) *Attorney, Agent, or Firm* — Novak Druce Connolly Bove + Quigg LLP

(57) ABSTRACT

A semiconductor device includes a substrate having a semiconducting surface having formed therein a first active region and a second active region, where the first active region consists of a substantially undoped layer at the surface and a highly doped screening layer of a first conductivity type beneath the first substantially undoped layer, and the second active region consists of a second substantially undoped layer at the surface and a second highly doped screening layer of a second conductivity type beneath the second substantially undoped layer. The semiconductor device also includes a gate stack formed in each of the first active region and the second active region consists of at least one gate dielectric layer and a layer of a metal, where the metal has a workfunction that is substantially midgap with respect to the semiconducting surface.

18 Claims, 10 Drawing Sheets

(56) References Cited

U.S. PATENT DOCUMENTS

| | | | |
|---|---|---|---|
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farrenkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,563,178 B2 | 5/2003 | Moriwaki et al. |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,727,130 B2 | 4/2004 | Kim et al. |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |

(56) References Cited

U.S. PATENT DOCUMENTS

| | | | |
|---|---|---|---|
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,193,253 B2 | 3/2007 | Doczy et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,390,719 B2 | 6/2008 | Jeon et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,638,433 B2 | 12/2009 | Yun et al. |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,709,901 B2 | 5/2010 | Li |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,786,537 B2 | 8/2010 | Manabe |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |

(56) References Cited

U.S. PATENT DOCUMENTS

| | | |
|---|---|---|
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,234 B2 | 6/2011 | Huffman et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,193,641 B2 | 6/2012 | Rachmady et al. |
| 8,196,545 B2 | 6/2012 | Kurosawa |
| 8,201,122 B2 | 6/2012 | Dewey, III et al. |
| 8,207,582 B2 | 6/2012 | Goswami |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,236,686 B2 | 8/2012 | Lee et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,293,632 B2 | 10/2012 | Kadoshima et al. |
| 8,299,562 B2 | 10/2012 | Li et al. |
| 8,319,287 B2 | 11/2012 | Lavoie et al. |
| 8,324,059 B2 | 12/2012 | Guo et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0052037 A1* | 3/2007 | Luan ........................ 257/369 |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |

(56) References Cited

U.S. PATENT DOCUMENTS

| | | |
|---|---|---|
| 2010/0207182 A1 | 8/2010 | Paschal |
| 2010/0270600 A1 | 10/2010 | Inukai et al. |
| 2010/0283107 A1 | 11/2010 | Muller et al. |
| 2010/0327364 A1 | 12/2010 | Tsuchiya |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1* | 10/2011 | Shifren et al. ............ 257/369 |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0199909 A1 | 8/2012 | Schulz et al. |
| 2012/0223363 A1 | 9/2012 | Kronholz et al. |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

Banerjee, et al. "Compensating Non-Optical Effects using Electrically-Driven Optical Proximity Correction", Proc. of SPIE vol. 7275 7275OE, 2009.

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 0.1 µm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

Abiko, H et al., "A Channel Engineering Combined with Channel Epitaxy Optimization and TED Suppression for 0.15µm n-n Gate CMOS Technology", 1995 Symposium on VLSI Technology Digest of Technical Papers, pp. 23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0.1-µm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-µm CMOS for Mixed Digital and Analog Aplications with Zero-Volt-Vth Epitaxial-Channel MOSFETs", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

(56) References Cited

OTHER PUBLICATIONS

Werner, P et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

* cited by examiner

CMOS GATE STACK STRUCTURES AND PROCESSES

CROSS-REFERENCE TO RELATED APPLICATIONS

This application claims priority to U.S. Provisional Patent Application No. 61/493,646, filed Jun. 6, 2011 and entitled "CMOS GATE STACK STRUCTURES AND PROCESSES", the contents of which are hereby incorporated by reference in their entirety.

FIELD

The present disclosure relates to complementary metal-oxide-semiconductor (CMOS) devices, and more specifically to methods for fabricating CMOS devices and CMOS devices therefrom.

BACKGROUND

Conventional polysilicon/silicon oxynitride (SiON) gate stacks have become increasingly unsuitable due to excessive gate leakage as the gate dielectric is proportionally thinned as gate length is decreased. The introduction of novel gate stack materials including high-K (HK) dielectric materials, and metal gates has enabled the continuation of Moore's Law with respect to transistor sizing at nodes smaller than 45/32 nm. However, different schemes to integrate those novel materials into gate stacks have been recently proposed. Gate-first (GF) and gate-last (GL), along with hybrid integration techniques that use some features of both gate-first and gate-last have all been described. The terminology 'first' and 'last' refers to whether the metal electrode is deposited before or after the high temperature activation anneal(s).

The gate-first approach relies on the use of very thin capping layers—aluminum (Al) based (e.g. $Al_2O_3$) for the PMOS and lanthanum (La) based (e.g. LaOx) for the NMOS transistors—to create dipoles that set a workfunction of the gate stack, defining its threshold voltage. In practice, systematic thermal instabilities of the HK/metal gate (MG) stacks can lead to significant workfunction shifts towards midgap (translating into higher PMOS threshold voltage (Vt)). This issue is particularly acute for PMOS, impeding use of gate-first stack construction in low Vt PMOS devices.

A second way of integrating HK/MG has been called a gate-last process. Typically, a sacrificial polysilicon gate is created over an already-formed hafnium-based dielectric gate oxide. The polysilicon gate forms the alignment for the high-temperature process steps such as the formation of source and drain regions in the substrate. After the high-temperature source-drain (S-D) and silicide annealing cycles, the dummy gate is removed and metal gate electrodes are deposited last. In an alternative process, the high-K dielectric itself can be deposited last, right before the metal gate electrodes, and after the complete removal of the dummy polysilicon gates. One possible advantage with this latter approach is to improve the device reliability and mobility at a scaled equivalent oxide thickness (EOT), which can be significantly degraded when the high-K dielectric has gone through the high thermal steps of the flow, just like in the gate-first approach. In both variations of a gate last flow (partial & full gate-last), the workfunction metals are not subjected to high thermal steps often associated with front-end flows.

Hybrid approaches to integrate HK/MG have been disclosed, combining both gate-first (for NMOS) and gate-last (for PMOS). Such hybrid approaches allow targeting high-performance system on a chip (SoC) die that include high PMOS Vt at scaled EOT, while avoiding the full, complex CMOS gate-last integration, that requires multiple CMP steps and dual metal gate deposition. However, both hybrid and gate-last process flows are very complex, with dual metal gates formation requiring costly and time consuming chemical mechanical polishing (CMP) steps. To maintain sufficient process window, such approaches may require restricted design rules (RDRs), such as use of 1-D design approach where gates are all aligned in a given direction.

In addition to the foregoing issues, available metal gate processing techniques for manufacture of low Vt devices required for SOC applications often require CMOS dual workfunction gate stacks. This complicates the HK/MG integration flow, whether gate-first, gate-last, or hybrid processing techniques are chosen. In a typical gate last flow, two metal gates are used, whereas in the case of gate-first, either two capping layers are needed (typically La-based for NMOS and Al-based for PMOS) or a single capping for NMOS (typically La-based) with a SiGe channel for PMOS. In such process flows, SiGe is used due to its valence band offset compared to silicon. Therefore, SiGe channels can deliver effectively lower Vt, in first order proportionally to its Ge content. However, the combination of these different materials and the structures required using these materials increase cost, process complexity, and device failure rates.

DETAILED DESCRIPTION

Figure 1:
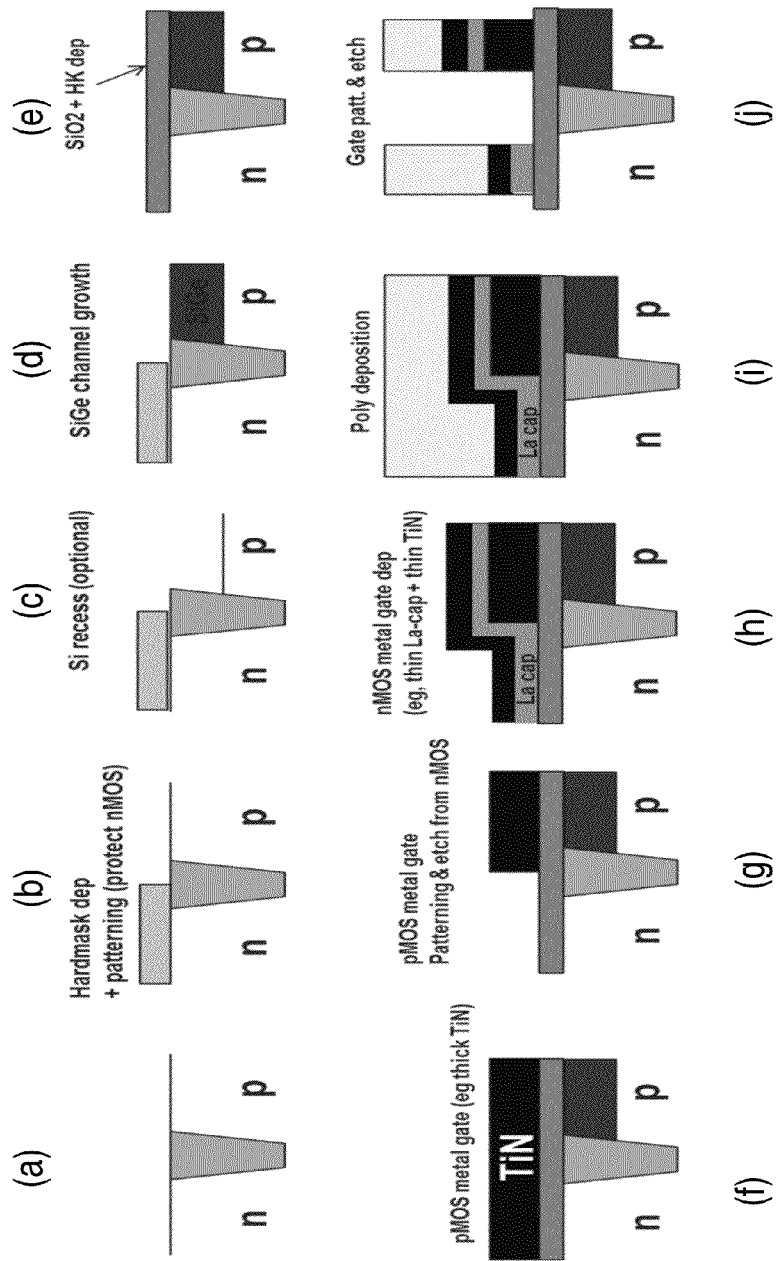
FIG. 1 illustrates a portion of a conventional gate-first manufacturing process that includes a SiGe PMOS channel.

Embodiments are described with reference to the attached figures, wherein like reference numerals are used throughout the figures to designate similar or equivalent elements. The figures are not drawn to scale and they are provided merely to illustrate the various embodiments. Several aspects of the embodiments are described below with reference to example applications for illustration. It should be understood that numerous specific details, relationships, and methods are set forth, but one having ordinary skill in the relevant art will readily recognize that the invention, limited only by the claims below, can be practiced without one or more of the specific details or with other methods. In other instances, well-known structures or operations are not shown in detail to avoid obscuring the embodiments. The embodiments are not limited by the illustrated ordering of acts or events, as some acts may occur in different orders and/or concurrently with other acts or events. Furthermore, not all illustrated acts or events are required to implement a methodology in accordance with the embodiments.

Digital and analog transistors have been available in decreasing sizes over time, with transistor channel lengths that formerly were tens of thousands of nanometers being reduced a thousand-fold to a hundred nanometers or less in length. However, maintaining transistor quality and electrical characteristics for such downwardly scaled transistors is difficult at nanometer scales, and can even be more difficult for supporting circuits requiring low threshold voltage transistors. This is particularly true for mixed signal die that support both analog and digital transistors, and include a mixture of high and low voltage threshold voltage transistors.

As noted above, dual metal gate process flows are now typically used for forming gate stacks in CMOS. One exemplary configuration of such a process flow is illustrated with respect to FIG. 1. FIG. 1 illustrates a portion of a conventional gate-first manufacturing process that includes a SiGe PMOS channel. In the illustrated gate stack flow, a low Vt PMOS can be achieved without using an aluminum base cap (e.g. AlO) in the PMOS gate-stack, which simplifies to some extent the gate stack module. It is to be noted that in this exemplary flow, the SiGe channel is shown as being formed after the shallow trench isolation (STI) features are formed. However, the SiGe channel can alternatively be formed before STI features are formed. This selective SiGe channel enables Gate-First to achieve low Vt CMOS device.

It should be noted that although the terms "silicon germanium" or "SiGe" will be used herein primarily to identify materials substantially consisting of an alloy of silicon and germanium, the various embodiments are not limited in this regard. Rather, the terms "silicon germanium" or "SiGe" also refer to any other alloys not exclusively comprising silicon and germanium. For example, a SiGe channel in the various embodiments can be formed using an alloy of silicon, germanium, and one or other materials or impurities, including, but not limited to carbon, boron, phosphorus, arsenic, indium, and antimony.

Referring now to the process flow shown in FIG. 1, this gate-first processing flow can include the following sequential process steps:

a. STI formation (and optionally ion implantation to form NMOS and PMOS wells);
b. NMOS hardmask formation;
c. Si recess etch in PMOS regions;
d. Selective SiGe formation in PMOS regions;
e. NMOS hardmask removal and blanket high-K dielectric formation;
f. Blanket PMOS metal gate formation;
g. Removal of PMOS metal gate from NMOS regions;
h. Blanket NMOS metal gate formation (e.g., thin La capping layer+thin TiN layer);
i. Blanket polysilicon deposition (and optional planarization); and
h. Gate stack patterning and etch.

Although the process in FIG. 1 and similar processes have been embraced for manufacture of digital and analog transistor devices, these processes are not without drawbacks. First, the process illustrated in FIG. 1 is substantially asymmetric. That is, NMOS and PMOS regions are not being processed in a substantially similar manner or using corresponding processing steps, adding additional complexity to the process flow. For example, the PMOS regions include SiGe processing steps, the NMOS regions include additional metal gate removal steps, and the number of layers gate stack for the PMOS region is different as compared to the NMOS regions. Second, this asymmetry in the process flow further results in the need for inclusion of additional process steps to account for the resulting differences in features. For example, recess or planarization steps can be required for addressing the inclusion of the SiGe in PMOS or the differences in gate stack height. Third, as some of the processes effectively link fabrication of PMOS and NMOS devices (e.g., gate stack formation processes) small variations in one process step for one type of device can result in significant variation in performance of the other type of device. Accordingly, a greater degree of monitoring of the process flow is generally required, a lower tolerance for variation can result, and tighter control over the various process steps is ultimately needed. As a result, while enhanced performance can be achieved based on the ideal devices as illustrated in FIG. 1, the high degree of process asymmetry, overall increased complexity of the process flow and an increased sensitivity to variations in process steps, ultimately leads to lower yields and increased failure rates.

The present inventors have recognized that a portion of the complexity involved with the process flow described above can be alleviated if substantially similar gate stacks could be used for both PMOS and NMOS or at least substantially similar process flows could be used for both PMOS and NMOS. Additionally, the present inventors also note that a portion of the complexity involved with the process flow described above can also be resolved if the channel formation processes for both PMOS and NMOS were substantially similar. Accordingly, the present inventors propose a new process flow and devices therefrom, for forming die that support a range of transistor devices, where the transistor devices include substantially a same or similar metal for both PMOS and NMOS transistor and substantially similar channel formation processes for both the PMOS and NMOS transistors, as described below One aspect is to provide a die that supports a range of transistor device types while improving the metal gate process integration by configuring the channels of the transistors to provide deeply depleted channel (DDC) transistors. DDC transistors are formed, for example, by forming a well for the CMOS devices by implanting dopants into a substrate to form a heavily doped screening layer ($10^{18}$ to $10^{20}$ atoms/cm$^3$). This may be followed by an undoped blanket epitaxial layer deposited over the screening layer, extending across multiple die and transistor die blocks. Such a blanket epitaxial layer should be formed so as to reduce upward migration of scattered dopants emplaced during the well implant. In some configurations, lightly doped Vt adjustment layers (between $5 \times 10^{17}$ and $2 \times 10^{19}$ atoms/cm$^3$) can also be formed in or adjacent to the screening layer in order to allow finer adjustment of threshold voltage and control against unwanted leakage current. Preferably, conventional threshold voltage setting methods by way of channel implants or halo implants are not used in the fabrication of DDC transistors.

Details regarding exemplary DDC transistor structures and manufacturing processes are more completely described in U.S. patent application Ser. No. 12/708,497 titled "ELECTRONIC DEVICES AND SYSTEMS, AND METHODS FOR MAKING AND USING THE SAME" and filed Feb. 18, 2010, U.S. patent application Ser. No. 12/971,884 titled "LOW POWER SEMICONDUCTOR TRANSISTOR STRUCTURE AND METHOD OF FABRICATION THEREOF" and filed Dec. 17, 2010, U.S. patent application Ser. No. 12/971,955 titled "TRANSISTOR WITH THRESHOLD VOLTAGE SET NOTCH AND METHOD OF FABRICATION THEREOF" and filed Dec. 17, 2010, U.S. patent application Ser. No. 12/895,785 titled "ADVANCED TRANSISTORS WITH THRESHOLD VOLTAGE SET DOPANT STRUCTURES" and filed Sep. 30, 2010, the disclosures of which are hereby incorporated by reference in their entirety, and U.S. patent application Ser. No. 12/895,813 titled "ADVANCED TRANSISTORS WITH PUNCH THROUGH SUPPRESSION" and filed Sep. 30, 2010.

An aspect of DDC transistors, is that they are based on forming a channel consisting of a substantially undoped layer, in other words, a channel formed without the inclusion of dopants to make an otherwise intrinsic semiconductor n-type or p-type (generally dopants having a concentration of $<5 \times 10^{17}$ atoms/cm$^3$, referred to in this disclosure as "undoped"), with a highly doped screening layer underneath. DDC transistor architectures and can simplify integration of various CMOS metal gate stack schemes, including both gate-first, gate-last or hybrid approaches. In particular, these transistors can be formed with a process flow that is substantially similar for both PMOS and NMOS transistors. For example, in the basic DDC transistor process flow, the PMOS and NMOS active regions can be created by forming N-type and P-type screening layers, respectively, followed by a blanket deposition of an undoped silicon epitaxial layer. Notably, SiGe in the PMOS channel is not used for DDC transistor architecture. Thus, the additional steps and complications in a conventional process flow resulting from integration of SiGe in the PMOS channel are eliminated. Further, eliminating SiGe from the PMOS channel helps to improve manufacturing yield.

In addition to the benefit of a simplified process flow due to the elimination of SiGe, the DDC device architecture also enables maintenance of good electrostatic control of the device, despite the channel being undoped or slightly doped and being devoid of conventional threshold voltage setting implants. The DDC device architecture further enables the use of gate stack structure with more relaxed workfunction requirements. Accordingly, this allows, in some cases, utilizing a single metal or substantially similar metals for both PMOS and NMOS transistors. In particular, there is no requirement for a band-edge workfunction, as described below.

In operation, the channel of a DDC device is fully depleted of majority carrier charges. As a result, the Vt (threshold voltage) of the DDC device will be much lower than a conventional MOSFET device (~300-400 mV), for the same gate stack. More importantly, this reduced Vt is provided without compromising the short channel control of the device. Accordingly, this higher potential to deliver low Vt than a conventional device for a given gate stack allows for matching a given Vt for a target application (Low-Vt, Regular-Vt, High-Vt, SRAM devices) using gate stacks with workfunction closer to midgap in the DDC case. Quantitatively, since DDC devices can deliver ~300-400 mV lower Vt than conventional devices at matched short channel control, it is possible to use workfunction ~300-400 mV closer to midgap than the close to band-edge conventional devices (NMOS ~4.1-4.2 eV, PMOS ~5.1-5.2 eV).

The result of the foregoing is that a single, close to midgap workfunction gate stack can be used to match the Vt of a conventional device, which typically requires close to band-edge workfunctions. This permits simplification of processes that formerly required a dual metal or other complex workfunction solution (conventional device) by allowing use of a single, close to midgap, workfunction solution. Accordingly, an embodiment described herein includes a DDC transistor architecture utilizing a gate stack for PMOS and NMOS transistors that uses a same or similar, close to midgap, workfunction metal.

Although the description above primarily contemplates the use of a same metal in the various embodiments, the present disclosure also contemplates that in other embodiments, complementary gate stacks, using different midgap metals can be used with DDC to achieve a similar effect. In these embodiments, the dopant profiles and transistor structures of the DDC transistor can be selected and designed to relax the requirements on workfunction separation between NMOS and PMOS, giving greater flexibility for gate metal selection and manufacture. That is, to allow a tunable workfunction.

In similar dual metal embodiments, workfunction selection for multiple transistor device die can utilize NMOS and PMOS metal swaps, as described in further detail in U.S. patent application Ser. No. 12/960,266 titled "SEMICONDUCTOR STRUCTURE AND METHOD OF FABRICATION THEREOF WITH MIXED METAL TYPES" and filed Dec. 3, 2010, the disclosure of which is hereby incorporated by reference in its entirety. Such processing schemes minimize mask steps by taking advantage of transistor device type differentiation by metal gate selection. Certain mask steps can be eliminated or substantially reduced by swapping the PMOS and NMOS metals between device types. For example, a semiconductor die can be processed to have a first device type that has a first PMOS transistor element with a metal gate M1 and a first NMOS transistor element with a metal gate M2. Instead of using a different metal M3 or additional process masking steps, a second device type on the same die can be processed to form a second PMOS transistor element with a metal gate M2 and a second NMOS transistor element with a metal gate M1. In effect, the respective PMOS and NMOS gate metals are swapped between device types, with the differing metal gate workfunctions resulting in different device types. Processing is simplified because an NMOS gate of a first CMOS device can be simultaneously built with a PMOS gate of a second CMOS device. Similarly, a PMOS gate of the first CMOS device can be simultaneously built with a NMOS gate of the second CMOS device.

Figure 2:
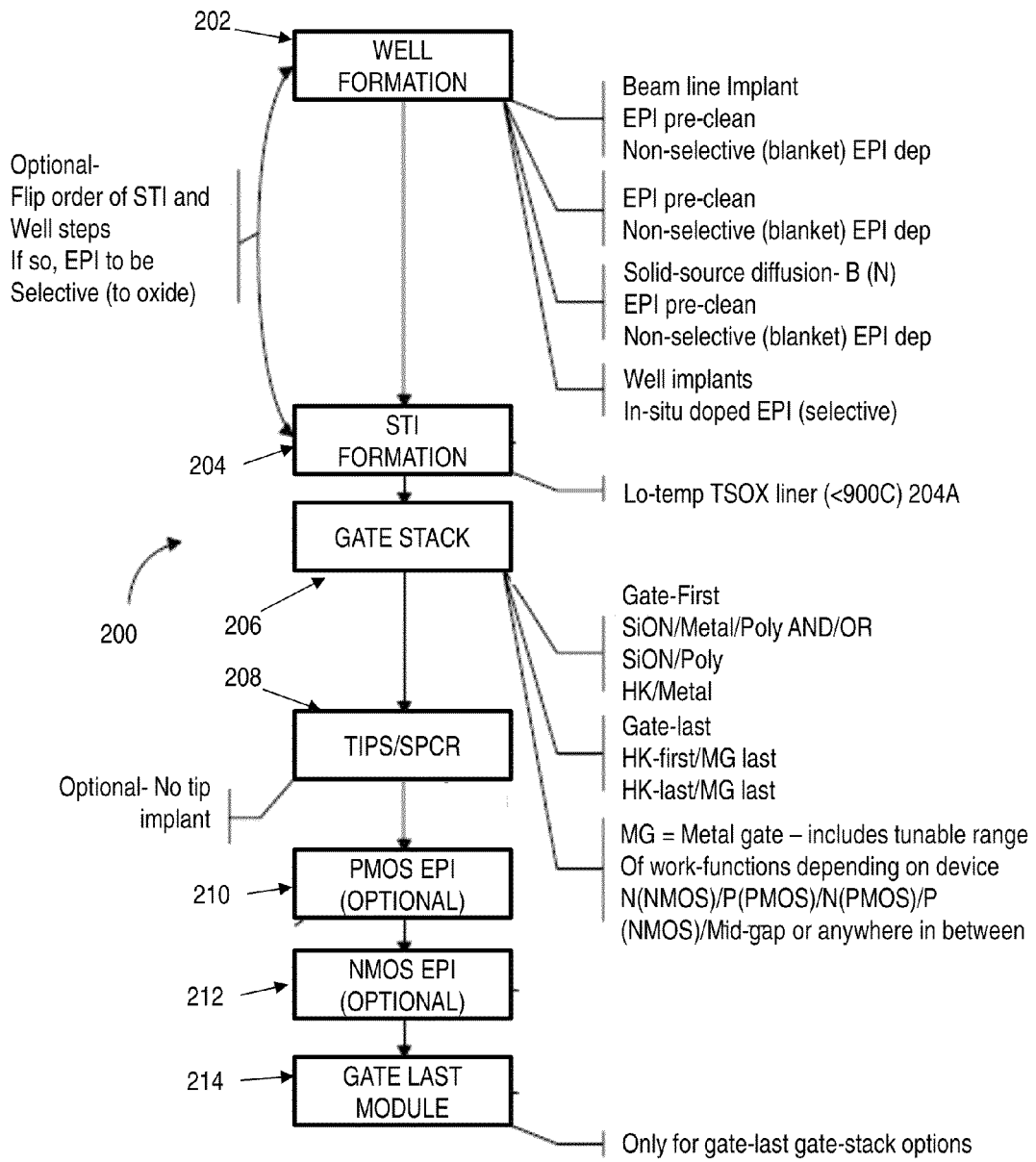
FIG. 2 shows an exemplary process for forming a transistor with improved metal gate processing in accordance with the various embodiments.

A general overall process flow for the variants described above is shown in FIG. 2. In particular, FIG. 2 shows an exemplary process 200 for forming a transistor with improved metal gate processing in accordance with the various embodiments. These along with other process steps allow for the processing and manufacture of integrated circuits that include DDC structured devices together with conventional or legacy devices, allowing for designs to cover a full range of analog and digital devices with improved performance and lower power.

The process begins at the well formation (202), which may be one of many different processes according to different embodiments and examples, and is followed by STI formation (204). However, well formation (202) can be before or after STI formation (204), depending on the application and results desired.

For the well formation (202), boron (B), indium (I) or other P-type materials may be used for P-type implants to form the NMOS channel, and arsenic (As), antimony (Sb) or phosphorous (P) and other N-type materials may be used for N-type implants to form the PMOS channel. A germanium (Ge) or carbon (C) implant or in-situ doped epitaxial layer may optionally be performed to reduce dopant migration. Well implants may include sequential implant, and/or epitaxial growth and implant of punch through suppression regions, screening layers having a higher dopant density than the punch through suppression region. Screening layers can set threshold voltage. Or, separate threshold voltage set layers can be formed, typically by implant or diffusion of dopants into a grown epitaxial layer on the screening region.

In some embodiments, the well formation (202) can also include a beam line implant of Ge/B (N), As (P), or Sb followed by an epitaxial (EPI) pre-clean process, and followed finally by non-selective blanket EPI deposition. Alternatively, the well may be formed using a plasma implant of B (N), As (P), followed by an EPI pre-clean, then finally a non-selective (blanket) EPI deposition. The well formation may alternatively include a solid-source diffusion followed by an EPI pre-clean, and followed finally by a non-selective (blanket) EPI deposition. As yet another alternative, well formation may simply include well implants, followed by in-situ doped selective EPI. Embodiments described herein allow for any one of a number of devices configured on a common substrate with different well structures and according to different parameters.

STI formation (204), which, again, may occur before or after well formation, can be performed in a variety of ways. In one exemplary process, this can include a low temperature trench sacrificial oxide (TSOX) liner at a temperature lower than 900 degrees C. After the STI formation (204), gate stack formation (206) can occur. The gate stack may be formed or otherwise constructed in a number of different ways, from different materials, and of different workfunctions.

The main processes for forming a gate stack consist of a gate-first or a gate-last process. As noted above, the terminology 'first' and 'last' refers to whether a metal layer for the gate stack is deposited before or after the high temperature activation anneal(s) of the flow. Gate-first processes include forming at least one gate dielectric layer, forming at least one metal layer over the gate dielectric layer, optionally forming one or more low resistance layers on the metal layer, and patterning the layers to form gate stacks for PMOS and NMOS. The gate dielectric layer can be a silicon oxide ($SiO_x$) layer or variation thereof (e.g., SiON and variants thereof), a higk-k material (e.g., $HfO_2$, HfSiON, or variants or combinations thereof). The metal layer can be any substantially midgap workfunction metal, such as TiN, TiSiN, TaN, or combinations thereof. As used herein, the term "substantially" refers to being within 20% of the stated value. The present disclosure also contemplates the use of any other midgap materials not listed above.

An exemplary gate stack configuration for a gate-first process includes, as listed in FIG. 2, a SiON/High-k dielectric/Metal/Polysilicon gate stack. Gate-last processes, also called replacement metal gate (RMG) processes, refer to processes in which a dummy gate structure is formed and thereafter replaced with the final gate. A gate-last process can include a high-K/metal gate stack wherein the gate stack can either be formed with "Hi-k first" flow or and "Hi-k last" flow. That is, the high-K dielectric material for the gate can be formed before or after the activation anneal.

Although the various embodiments have been described generally with respect to using a same metal for both PMOS and NMOS, the present disclosure contemplates that another option is to provide a metal gate that includes a tunable range of workfunctions depending on the device construction, N(NMOS)/P(PMOS)/N(PMOS)/P(NMOS)/Midgap or anywhere in between.

Next, lightly-doped tip regions may be formed (208) following the formation of the gate-first stack or the dummy gate for the gate-last process. Tips are usually implanted, and the dimensions of the tips are selected based upon the device design and generally rely upon a thin spacer on either side of the gate (or dummy gate if gate-last process is used) to set the lateral dimension. However, in some embodiments, there may be no tip implant. Next, in steps (210 and 212), PMOS and NMOS source/drain regions are formed by doping the substrate on either side of the tips. The dimensions of the source/drain regions are selected based upon the device design and generally rely upon a second spacer formed on either side of the gate (or dummy gate if gate-last process is used) to set the lateral dimension. Typically the source/drain regions are implanted or diffused, but optionally, selective epitaxial deposition may be used (after an initial etch is performed to open the area for the source/drain in the substrate), especially for the case of including performance enhancers such as Ge for creating strained channels. In the case of a gate-last process, a gate-last module can then be performed (214) to form a surrounding oxide, remove the dummy gate, and fill the dummy gate-openings with the desired stack including metal material.

Specific embodiments of gate first and gate processing techniques are described below with respect to FIGS. 3A, 3B, 4, 5, 6, 7, and 8. However, prior to describing these processes, the process flows for the various types of devices (conventional versus DDC) as discussed below are shown with respect to FIGS. 9A, 9B, and 9C. FIG. 9A shows an exemplary process flow for forming active areas for logic and SRAM devices in conventional CMOS that includes formation of SiGe channels for PMOS devices. FIG. 9B shows an exemplary process flow for forming active areas for logic and SRAM for DDC devices. FIG. 9C shows an exemplary process flow for forming active areas, where the active areas for logic are configured to provide conventional CMOS that includes SiGe channels for PMOS devices and the active areas for SRAM are configured to provide DDC devices.

As shown in FIG. 9A, the conventional process flow consists of forming active areas for PMOS and NMOS devices via conventional well implants to form N-well (NW) and P-well (PW) areas, respectively. Various photolithography and masking steps can be utilized to define the active areas. Further, additional or different implants can be provided for the logic and SRAM active areas via additional photolithography and masking steps. Once the active areas are formed, a hardmask layer can be formed and patterned to define the regions for the SiGe channels (i.e., the PMOS devices in N-wells). As shown in FIG. 9A, this can be accomplished via the formation and patterning of a hardmask layer (Oxide HM). This can include various deposition and/or growth steps to form the hardmask layer, followed by one or more photolithography and etch steps. The etch steps can be wet or dry, depending on the process flow. It is further noted that although FIG. 9A shows the hardmask layer as an oxide hardmask layer, the various embodiments are not limited in this regard. Rather, the present disclosure contemplates that any type of hardmask layer compatible with the process flow can be utilized in the various embodiments.

Once the hardmask layer is formed and patterned, the SiGe PMOS channels (SiGe ch) can be formed. FIG. 9A contemplates the use of a selective SiGe growth technique to limit formation of SiGe to the open areas defined by the hardmask. Once the SiGe PMOS channels are formed, the hardmask can be removed and STI formation can proceed. As shown in FIG. 9A, the end result is a series of elevated SiGe PMOS channels with respect to the NMOS channels. Accordingly, planarization may be needed in subsequent steps. However, as noted above with respect to FIG. 1, an alternative process flow can involve performing a recess etch prior to SiGe formation so that the resulting SiGe PMOS channels and the NMOS channels are at substantially the same level. The conventional flow at FIG. 9A contemplates that STI formation can precede SiGe formation or even the implants for the P-wells and N-wells.

A DDC process, as shown in FIG. 9B, varies in several respects from the conventional process shown in FIG. 9A. Initially, the process flow embodied in FIG. 9B consists of implants. In particular, a DDC screening layer implant is provided for NMOS active areas (DDC_PW) and PMOS active areas (DDC_NW). The screening layer implants may be formed directly into previously formed wells. In contrast with conventional well implants, screening implants are configured to provide a high concentration of dopants in the active areas for both logic and SRAM, as noted above to screen the well therein below and to set the depletion depth of the to-be-formed undoped channel above when the resulting transistor is operating. The screening layer implants are preferably performed using a reduced energy but higher dose compared with the process used for the well implants for FIG. 9A. DDC screening layer implants can be different in concentration and thickness for logic and SRAM active areas. Generally, for higher Vt devices, the screening layer is more highly concentrated and thinner. Although not shown, if desired, additional implants may be performed to set threshold voltage by implanting dopants into the screening layer. The threshold voltage setting implants are preferably performed using a reduced energy and lower dose compared with the process used for the screening layer implants. Once the DDC implants are performed, then preferably, a blanket undoped silicon epitaxial layer is formed using a process that is within a thermal budget tailored to either avoid unwanted migration of dopants or to tightly control any degree of upward migration of dopants from the screening layer. Preferably, the epitaxial growth process is highly uniform in deposition rate to allow tight control of resulting thickness of undoped silicon. Preferably thereafter, the active areas can be isolated via STI formation (STI).

The present disclosure also contemplates that DDC devices can be formed in combination with conventional devices on the same wafer or substrate. This is illustrated in FIG. 9C. The flow in FIG. 9C begins in substantially a similar manner than that shown in FIG. 9B with the DDC screening layer implants and the formation of the epitaxial silicon layer. However, in FIG. 9C, the active areas associated with logic are intended to form conventional devices and DDC devices are limited to SRAM areas. Accordingly, appropriate masking and photolithography steps are performed to limit the DDC screening layer implants to the SRAM active areas. After the silicon epitaxial layer is formed, the process flow can proceed to complete the conventional devices substantially in accordance with the flow described in FIG. 9A. However, to limit the conventional well implants to the logic areas, appropriate masking and photolithography steps are performed to limit the N-well and P-well implants to the logic active areas. Further, to limit SiGe formation to the logic, the hardmask can be patterned so as to only expose PMOS active areas in the logic. Once the SiGe is formed for the logic area, STI formation can proceed, as previously described with respect to FIG. 9A.

Having discussed various channel formation process flows, the gate stack process flows can now be discussed in greater detail. Referring back to FIG. 3A, there is shown a cross-section view after gate stack formation for logic and SRAM areas for (top) conventional devices and (bottom) DDC devices in accordance with an embodiment. The channels for the conventional devices can be formed according to, for example, the process flow of FIG. 9A. The channels for the DDC devices can be formed according to, for example, the process flow of FIG. 9B.

Figure 3A:
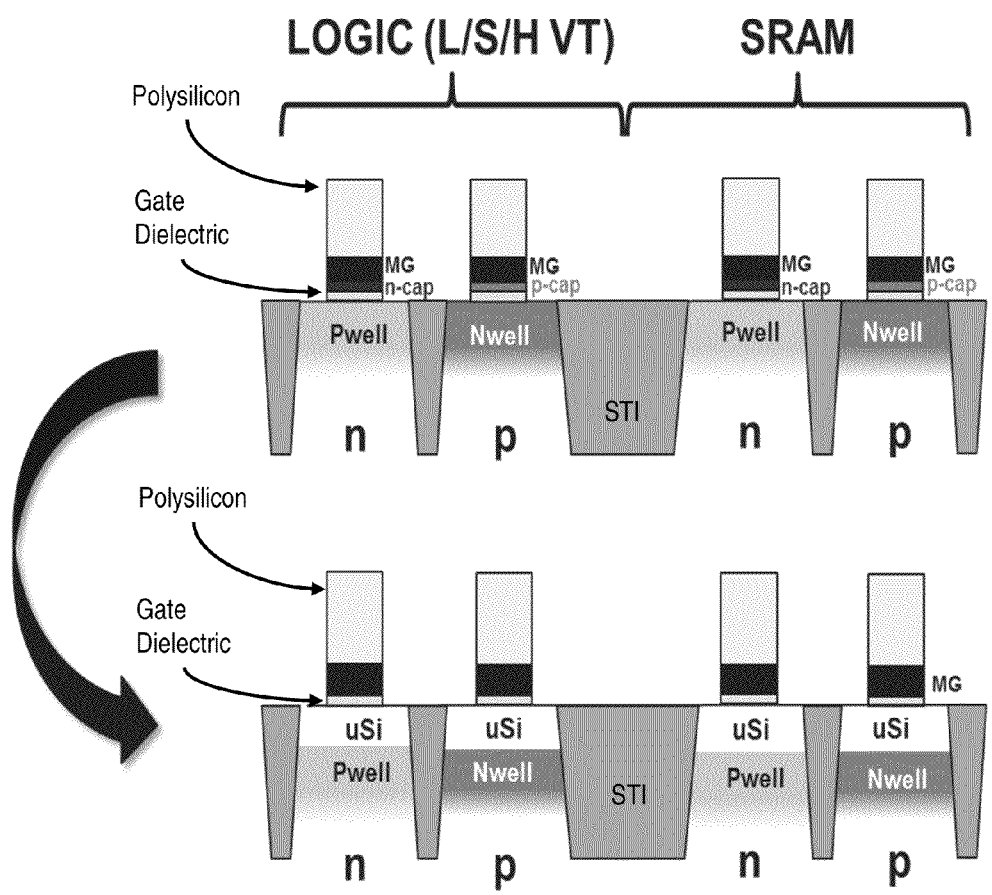
FIG. 3A shows a cross-section view after gate stack formation for logic and SRAM areas for (top) a conventional devices and (bottom) DDC devices in accordance with an embodiment.

FIG. 3A illustrates how a process flow is simplified when using DDC devices and a high-K/Metal/Polysilicon gate stack as compared to the process flow for a conventional device. As illustrated in the top portion of FIG. 3A, a conventional device implemented in both logic and SRAM areas with a gate-first CMOS scheme using a high-K dielectric layer ("GD"), a metal gate ("MG"), and a polysilicon contact layer ("Poly") requires the insertion of selective high-K capping layers for NMOS (e.g., La-based) and for PMOS (e.g., Al-based). That is, dual workfunction gates are required to provide correct workfunctions to enable PMOS and NMOS devices to properly operate. In contrast, as shown in the bottom portion of FIG. 3A, the use of DDC devices allows use of a simplified single gate stack. In particular, a simple gate stack with no individualized high-K capping layers is provided. The dual workfunction (with selective high-K capping layers for NMOS and PMOS) for a conventional device can be replaced with a single midgap workfunction (no high-K capping layer) for a DDC device. Further, since the selective SiGe channel for PMOS is not required for DDC, both a simplification of the gate stack (no high-K capping layer) and simplification of the channel (no need for selective epitaxial channel) can be achieved by using DDC device architecture, while achieving the same or improved device performance.

Figure 3B:
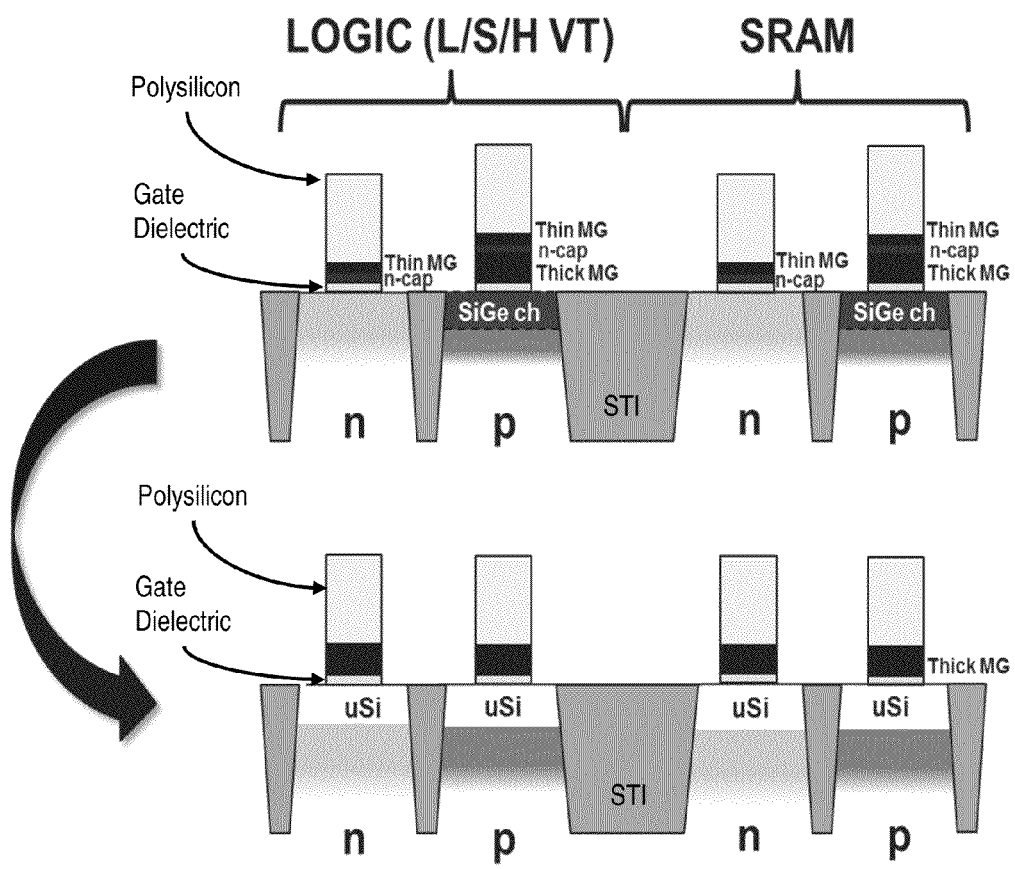
FIG. 3B shows a cross-section view after gate stack formation for logic and SRAM areas for (top) another conventional device and (bottom) DDC devices in accordance with an embodiment.

The advantages of the gate stack in the bottom portion of FIG. 3A are more apparent when compared pictorially to a structure resulting from the conventional process flow of FIG. 1. FIG. 3B, shows a cross-section view after gate stack formation for logic and SRAM areas for another conventional device (top) and DDC devices (bottom) in accordance with an embodiment. FIG. 3B illustrates how a process flow is simplified when using DDC devices and a high-K/Metal/Polysilicon gate stack as compared to the process flow for a conventional device shown in FIG. 1. As noted above with respect to FIG. 1, the conventional process flow shown therein requires not only the formation of a SiGe channel for PMOS, but also formation of the different gate structures for PMOS and NMOS. In the example of FIG. B, the same capping material is used but the work function is modified between NMOS and PMOS by different metal layers for each. This is shown in the top portion of FIG. 3B. In contrast, as shown in the bottom portion of FIG. 3B, DDC devices allow once again the use of a simplified single gate stack. In particular, a DDC device provides a gate stack in which no high-K capping layer is required for NMOS. Accordingly, the dual workfunction (with selective high-K capping on NMOS and thick metal gate on PMOS) for the conventional device of the top portion of FIG. 3B can be replaced with a single midgap workfunction (no high-K capping) for a DDC device. Further, since the selective SiGe channel for PMOS is not required for DDC, both a simplification of the gate stack (no high-K capping) and simplification of the channel (no need for selective epitaxial channel) can be achieved by using DDC device architecture to achieve the same or improved performance.

Figure 4:
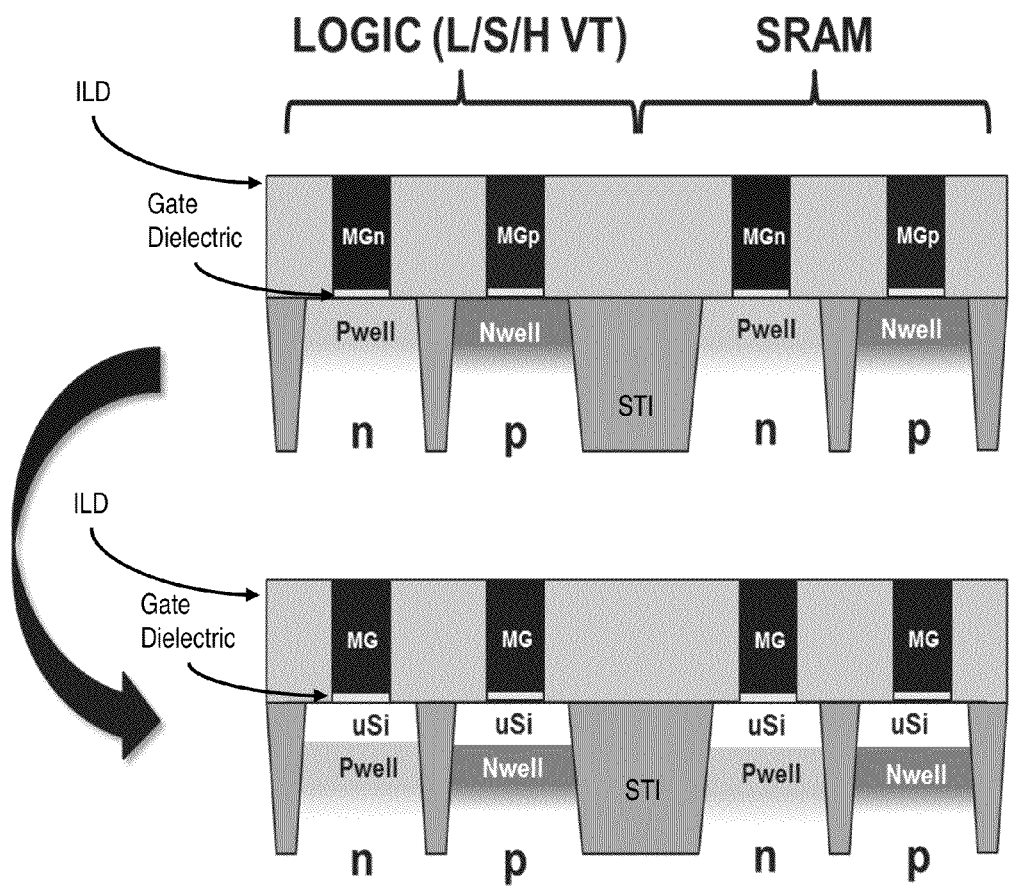
FIG. 4 shows a cross-section view after gate stack formation for logic and SRAM areas, for (top) a conventional devices and (bottom) DDC devices in accordance with an embodiment, formed using a gate-last process.

For gate-last processes, similar simplifications can be observed, as shown in FIG. 4. FIG. 4 shows a cross-section view after gate stack formation for logic and SRAM areas, for conventional devices (top) and DDC devices (bottom) in accordance with an embodiment, formed using a gate-last process. FIG. 4 illustrates how a gate last process flow is simplified when using DDC devices and a high-K/Metal gate stack as compared to the process flow for a conventional device. In a conventional process flow, as shown in the top portion of FIG. 4, complementary gate stacks for CMOS (dual metal gates MGn and MGp) are required to achieve the necessary workfunctions. In contrast, since the DDC architecture provides a greater ability to set and control Vt, a simplified single midgap gate-last scheme can be used. Accordingly, a simplification of the gate stack is provided while achieving the same or improved performance.

As noted above, the present disclosure contemplates that a single midgap workfunction for DDC may not yield a desired device performance. Accordingly, in some embodiments a dual workfunction CMOS gate stacks can be used while still providing a process flow that is substantially simplified as compared to conventional process flows. In such embodiments, rather than using band edge metals to achieve the dual workfunction gates, as in conventional devices, the workfunction can be slightly shifted away from the midgap (~4.6 eV). For example, a NMOS gate stack can be shifted toward the conduction band by ~100-200 meV (meaning a workfunction of 4.5 eV or 4.4 eV) and a PMOS gate stack can be shifted toward the valence band by ~100-200 mev (meaning a workfunction of 4.7 eV or 4.8 ev).

As can be seen from the foregoing, the workfunctions for the DDC device require less NMOS/PMOS delta (~200-400 meV) as compared to the workfunctions required for conventional devices (typically, 1000-1100 meV) to come close to the silicon conduction (~4.1 eV) and valence band edges (~5.2 eV), respectively. This reduced delta enables simpler processing from a materials stand-point. First, in the case of gate-first process, workfunction shifts for NMOS and PMOS gate stacks can be achieved using lanthanum (La) based and aluminum (Al) based capping layers, respectively. However, for DDC devices, less La and Al can be used to achieve this reduced NMOS and PMOS workfunction shift from midgap. While this still requires capping layers, the simplification in the process is achieved because of the reduced need to compensate for the effects of the capping layers. In particular, less La and Al doping can be beneficial in reducing the risk of mobility or reliability degradation and thus reduces the need for other processes that counter such effects. Alternatively, the reduced shifts can be obtained using alternate methods and thus the capping layers can be omitted. For example, if only a moderate workfunction shift from midgap is required (e.g. less than about 200 meV), ion implantation of a workfunction modifying material, for instance, nitrogen, directly into the metal gate is sufficient to make the necessary workfunction shift. In still other embodiments, ion implantation of a work-function modifying material into the metal gate can be used in conjunction with capping layers to make larger workfunction shifts while reducing the amount of capping layer materials needed. Again, this reduces the risk of mobility or reliability degradation and thus reduces the need for other processes that counter such effects.

As an alternative to capping layers and implants, the present disclosure contemplates the use of dual workfunction gate stacks using different metals. For example, dual workfunction gate stacks can be formed using metals selected from TiN, TaN, WN, Al, Ti, and any combinations of alloys thereof. Although the use of multiple metal gate materials might appear to introduce complexity, this nonetheless provides a process flow that is simpler than that for a conventional process. This is illustrated with respect to FIGS. 5-7. In particular, FIGS. 5-7 show how process flows that include gate-first with SiGe channel PMOS, gate-first without SiGe channel PMOS, and gate-last can be improved by simplification of the dual workfunction CMOS gate stacks and DDC transistors, with workfunctions of ~4.4-4.5 eV and 4.7-4.8 eV for NMOS and PMOS, respectively.

Figure 5:
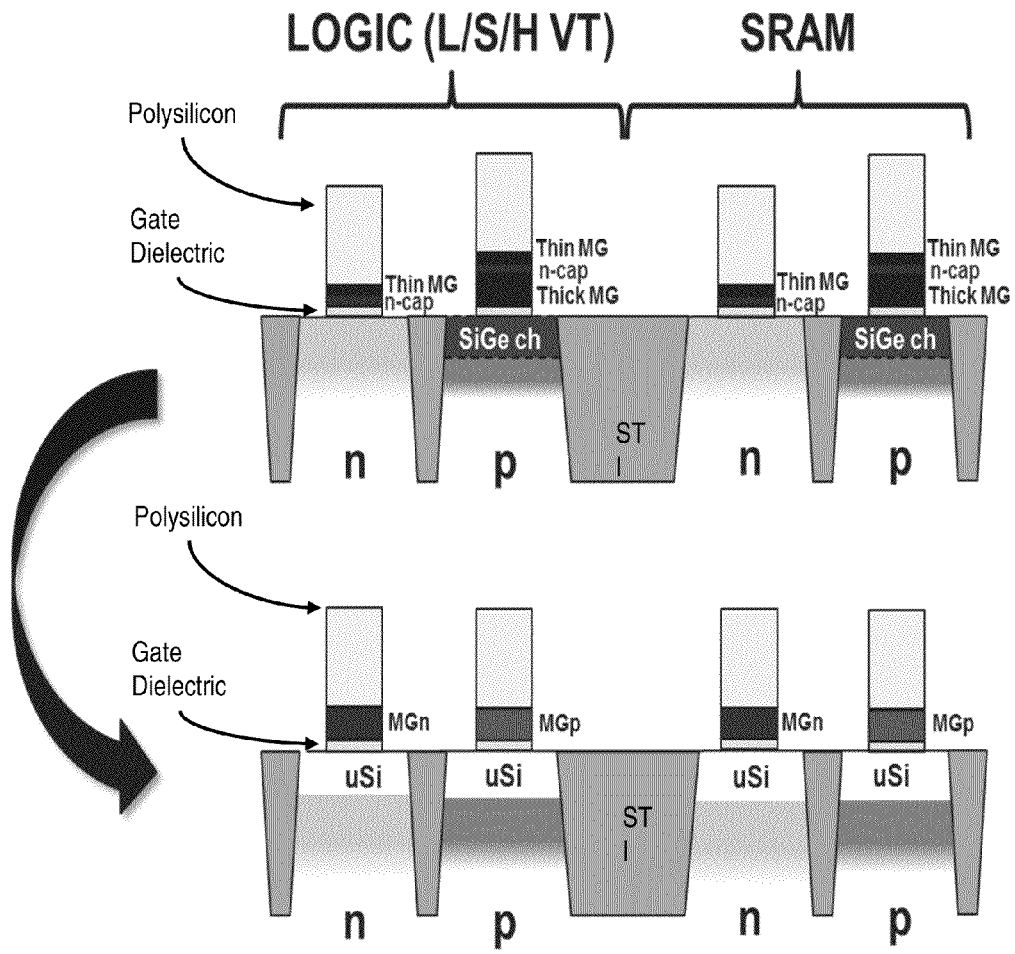
FIG. 5 shows a cross-section view after gate stack formation for logic and SRAM areas, for (top) conventional devices and (bottom) DDC devices in accordance with an embodiment using dual metal gates, formed using a gate-first process.

FIG. 5 shows a cross-section view after gate stack formation for logic and SRAM areas, for conventional devices (top) and DDC devices (bottom) in accordance with an embodiment using dual metal gates, formed using a gate-first process. FIG. 5 illustrates how a process flow is simplified when using DDC devices having dual workfunction gate stack formed as described above as compared to the process flow shown in FIG. 1 for a conventional device. The top portion of FIG. 5 shows a gate-first CMOS from dual workfunction and dual channel (NMOS: Si, PMOS: SiGe) as previously described with respect to FIG. 1. The bottom portion of FIG. 5 shows a gate-first CMOS from dual workfunction gate CMOS gate stack (NMOS workfunction MGn ~4.4-4.5 eV, and PMOS workfunction MGp ~4.7-4.8 eV) and DDC channels. The simplification here entails removing the steps required to form the SiGe PMOS channels, forming the NMOS and PMOS metal gate stacks (by selecting the materials and thicknesses based upon the desired work functions) by masking off one set while forming the other and then masking the formed metal gates while forming the other metal gates. Since the metal gates for all are of the same vertical height, there is no need for a subsequent planarization of the polysilicon. As can be appreciated, the formation of NMOS metal ("MGn") and PMOS metal ("MGp") for DDC channels is relatively simpler than the etch, multi-dimensional deposition, and planarization steps required for the structure in the top row of FIG. 5, while still providing the same or enhanced device performance.

Figure 6:
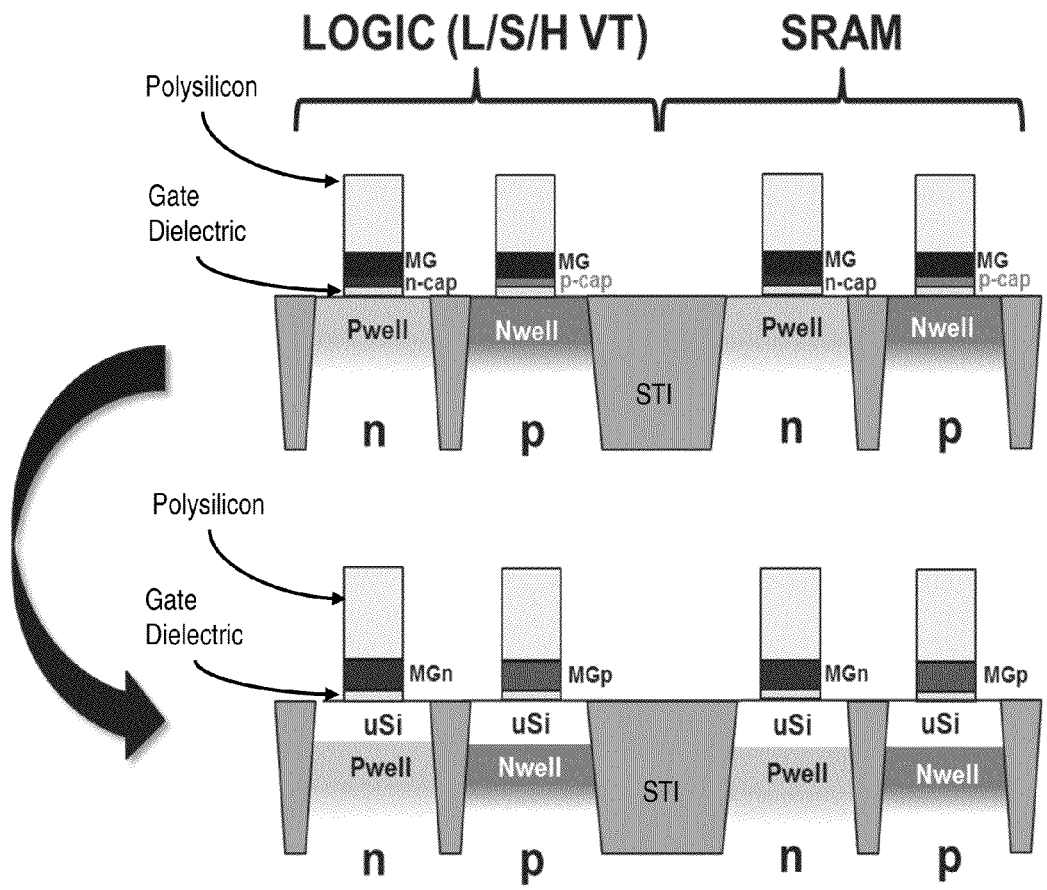
FIG. 6 shows a cross-section view after gate stack formation for logic and SRAM areas, for (top) conventional devices using dual capping layers and (bottom) DDC devices in accordance with an embodiment using dual metal gates, formed using a gate-first process.

Similarly, FIG. 6 shows a cross-section view after gate stack formation for logic and SRAM areas, for (top) conventional devices using dual capping layers and (bottom) DDC devices in accordance with an embodiment using dual metal gates, formed using a gate-first process. Like FIG. 5, FIG. 6 illustrates simplification of gate-first CMOS from dual workfunction based on n-type capping layers and p-type capping layers (NMOS workfunction ~4.1-4.2 eV, PMOS workfunction ~5.1-5.2 eV), as shown in the top portion of FIG. 6, to a dual workfunction gate CMOS gate stack with relaxed workfunction requirements (NMOS workfunction MGn ~4.4-4.5 eV, and PMOS workfunction MGp ~4.7-4.8 eV), as shown in the bottom portion of FIG. 6. Specifically, rather than utilizing multiple capping layers (n-cap and p-cap) in combination with a single metal gate (MG), two different metal gate materials (MGp and MGn) are formed from selected midgap materials. As previously described with respect to FIG. 3B, the elimination of capping layers eliminates the complexities and issues regarding mobility and reliability degradation associated with increased amounts of La and Al doping. The process is also simplified in that rather than three processes (formation of n-cap, p-cap, and MG), only two processes are needed (formation of MGp and MGn). This process can be further simplified by utilizing the same metal for MGp and MGn and utilizing ion implantation of work-function adjusting materials to adjust the workfunctions.

Figure 7:
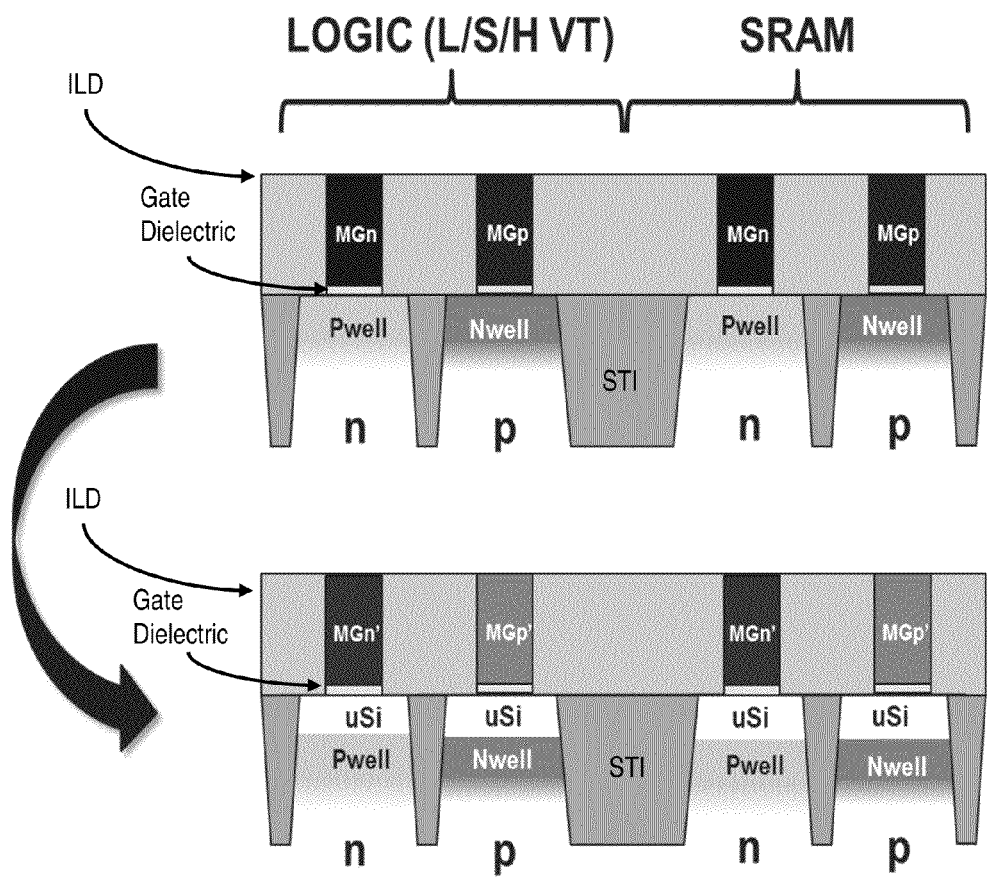
FIG. 7 shows a cross-section view after gate stack formation for logic and SRAM areas, for (top) conventional devices using metal layers and (bottom) DDC devices in accordance with an embodiment using dual metal gates, formed using a gate-last process.

In yet another example, FIG. 7 shows a cross-section view after gate stack formation for logic and SRAM areas, for conventional devices (top) using metal layers and DDC devices (bottom) in accordance with an embodiment using dual metal gates, formed using a gate-last process. FIG. 7 also illustrates simplification of gate-last CMOS from dual workfunction (NMOS workfunction MGn ~4.1-4.2 eV, PMOS workfunction MGp ~5.1-5.2 eV) to a dual workfunction gate CMOS gate stack with relaxed workfunction requirements (NMOS workfunction MGn' ~4.4-4.5 eV, and PMOS workfunction MGp' ~4.7-4.8 eV). As with the process associated with FIG. 6, simplification can be achieved by utilizing the same midgap metal for MGp' and MGn' and utilizing implant processes to adjust the workfunctions as needed.

As discussed above with respect to FIG. 9C, a mix of conventional and DDC devices may be desirable for some types of circuits and systems. For example, it may be desirable to use DDC devices on a die providing a system on a chip (SoC) or other die that include static random access memory (SRAM) circuits or other high performance circuits that would benefit from superior Vt control (improved Vt matching). For such die, it is possible to integrate DDC devices in the SRAM only, with HK/MG gate-first, as previously described with respect to FIG. 9C and as further illustrated in FIG. 8.

Figure 8:
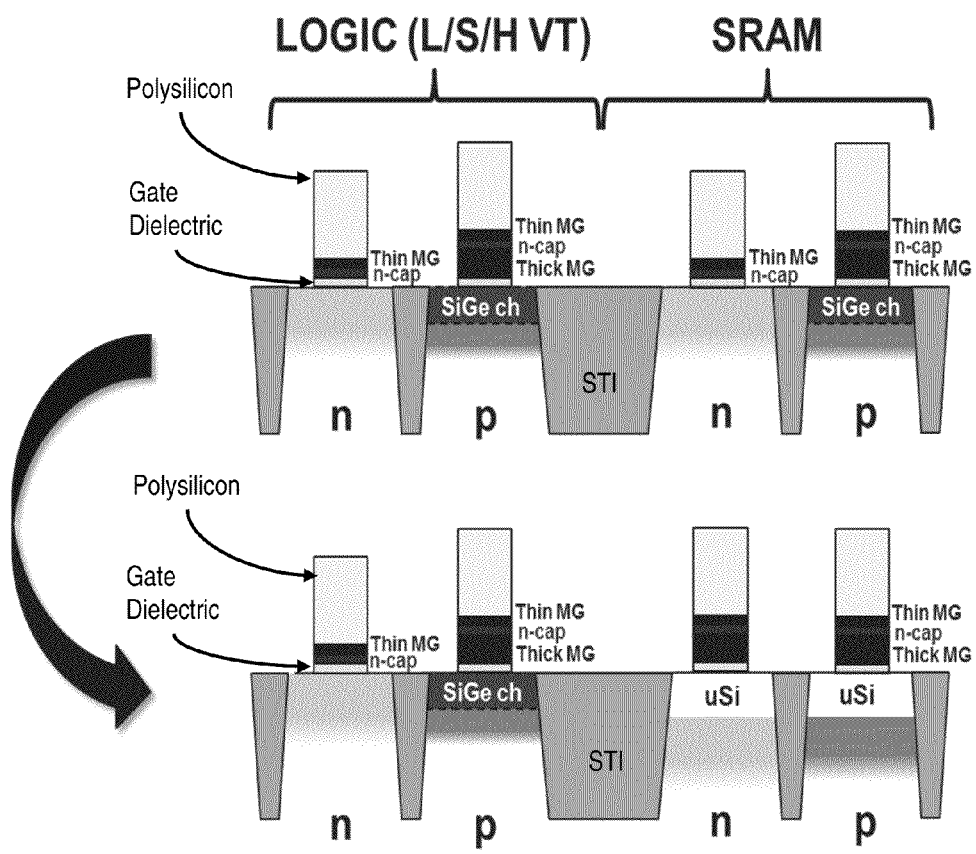
FIG. 8 shows a cross-section view after gate stack formation for logic and SRAM areas, for (top) conventional devices using the process of FIG. 1 and (bottom) DDC devices in accordance with an embodiment using the PMOS gate stack of FIG. 1.
Figures 9A, 9B, 9C:
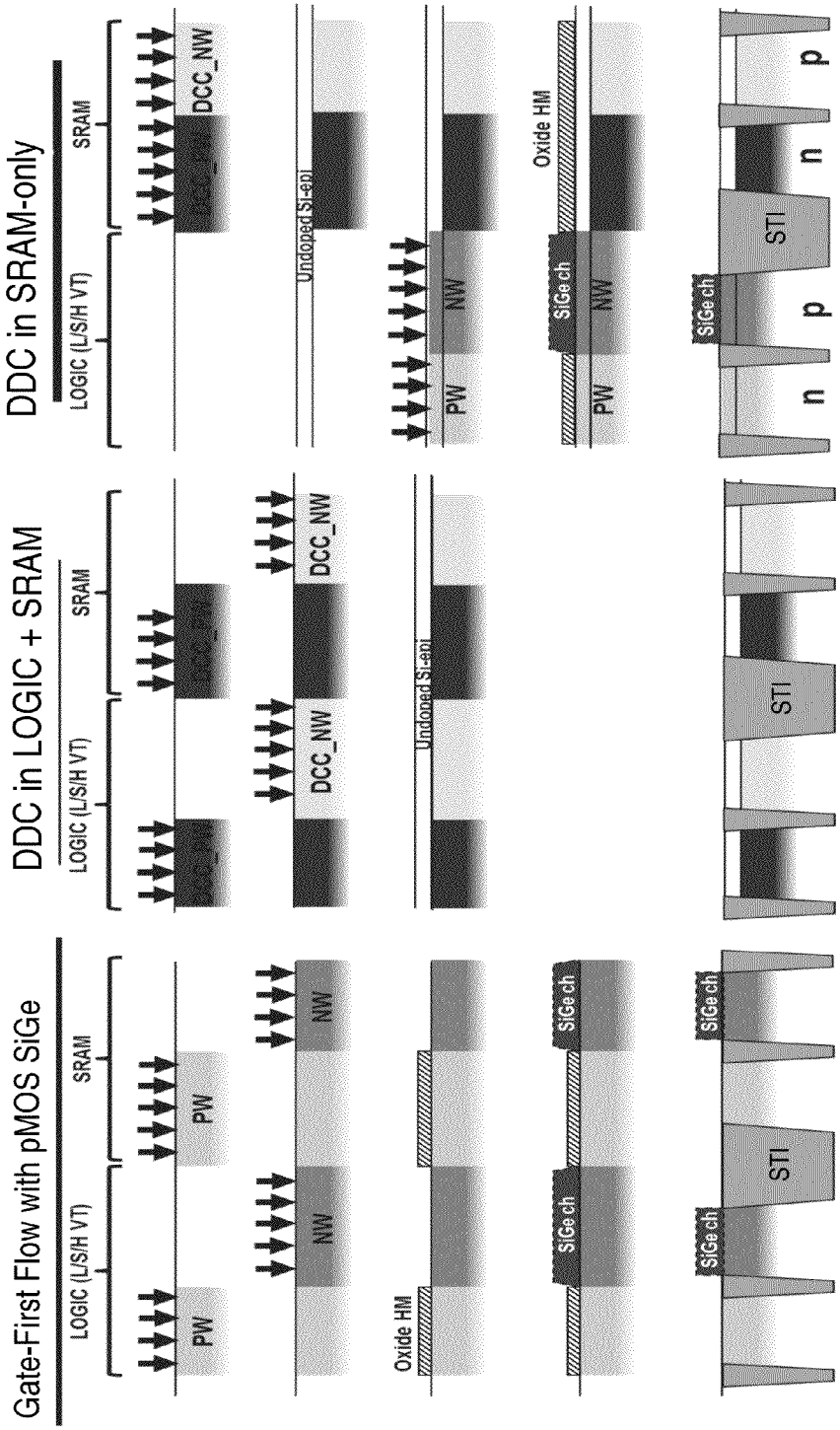
FIG. 9A shows an exemplary process flow for forming active areas for logic and SRAM devices in conventional CMOS that includes formation of SiGe channels for PMOS devices.
FIG. 9B shows an exemplary process flow for forming active areas for logic and SRAM for DDC devices.
FIG. 9C shows an exemplary process flow for forming active areas, where the active areas for logic are configured to provide conventional CMOS that includes SiGe channels for PMOS devices and the active areas for SRAM are configured to provide DDC devices.

FIG. 8 shows a cross-section view after gate stack formation for logic and SRAM areas, for (top) conventional devices using the process of FIG. 1 and (bottom) DDC devices in accordance with an embodiment using the PMOS gate stack of FIG. 1. In particular, FIG. 8 shows how DDC devices can be incorporated into a conventional process flow to provide SRAM or other high performance devices and conventional devices in a logic portion. In this case, the active areas for the logic and SRAM portions can be formed as previously described with respect to FIG. 9C. As noted above, since high performance DDC devices can be designed with relaxed workfunction requirements, both types of the DDC SRAM devices (PMOS and NMOS) can utilize either the NMOS gate stack or the PMOS gate stack to deliver the appropriate high Vt. Part of the simplification here is also due to relaxed constraints during processing. In particular, NMOS/PMOS gate stack boundaries located near separating STI regions are not required. Thus, this can result in increased die yields due to the simplified process.

As shown above, each of the simplifications described above relies on selection of a gate stack process combined with a DDC channel. Accordingly, the only added concern in any of the foregoing processes is to ensure integrity of the undoped or slightly doped epitaxial layer. For example, maintaining the channel of the DDC device undoped throughout the entire processing provides low random dopant fluctuation (RDF), and consequent good matching characteristic and tight Vt control. In order to do that, special attention needs to be paid to the thermal budget steps of the process flow, with modification of some steps to reduce dopant diffusion into the undoped channel. Steps to ensure such integrity are described in the aforementioned documents incorporated by reference.

In the case where DDC devices are co-integrated with conventional devices, as illustrated in FIGS. 8 and 9C, minimization of the thermal budget of the process steps following the undoped epitaxial layer growth may be needed. This can be accomplished as follows without adding significant complexity to the process flow:

The anneal of the N-well and P-well of the legacy devices should be minimized. This can be achieved in different ways: lower the temperature of the (long) soak anneal to 850 C or less, or use of spike anneal (duration of 1 second or less) or use of millisecond anneal (like laser or flash anneal), or any combination of the above.

The hardmask blocking layer protecting the NMOS region as well as the DDC devices, that can be oxide and/or nitride, should be processed at low temperature preferably below ~500 C, using plasma enhanced chemical vapor deposition (PECVD) or atomic layer deposition (ALD) techniques.

The SiGe channel module needs to be processed at low temperature, which implies that the pre-epitaxy clean and bake should be performed preferentially below 800 C and the SiGe epitaxy as well as the thin Silicon capping layer that is optionally grown on top of it should be performed at temperatures below 650 C, preferentially.

The STI module should be processed at low temperature.

A low temperature gate stack module should be used:

For both gate-first and gate-last, if the starting silicon dioxide is grown by thermal oxidation, then the oxidation temperature should be kept preferably below 850 C, or at least not exceed 900 degrees C. This also applies for the optional nitridation step of this interface layer. Deep Plasma Nitridation (DPN) can be used for that step, and the same thermal budget limitation as for the $SiO_2$ growth applies.

For the gate-first process as well as for the so-called "partial" gate-last process (i.e. high-K first and metal-gate-last), the high-K film is deposited after the $SiO_2$ interface layer formation. If the high-K film is deposited by ALD, the typical deposition temperature is typically low enough that it is not a concern (<550 C). However, if a metal organic chemical vapor deposition (MOCVD) technique is used, then the temperature again needs to be sufficiently low (preferably below 800 C). If a post-deposition annealing step is applied to densify the film, then its thermal budget should be kept below about 850 C if a spike-like anneal is applied (duration <5 seconds), or below 750 C if a "long" soak-like anneal is applied (duration >5 seconds).

For all HK/MG flows (gate-first and gate-last, "full" or "partial"), a polysilicon gate is deposited after the metal gate layer. The thermal budget of this deposition can also be a concern and should be reduced to preferably below 650 C.

For all HKMG flows, the source/drain dopant activation anneal is commonly done at high temperature using either a spike anneal combined, optionally, with a millisecond anneal. Here, to limit the overall thermal budget, a spike peak temperature of preferably less than 1030 C and an optional millisecond anneal with a peak temperature of preferentially less than 1250 C is used to minimize dopant diffusion into the channel.

While certain exemplary embodiments have been described and shown in the accompanying drawings, it is to be understood that such embodiments are merely illustrative of and not restrictive, and various other modifications may occur to those ordinarily skilled in the art. Accordingly, the specification and drawings are to be regarded in an illustrative rather than a restrictive sense.

While various embodiments have been described above, it should be understood that they have been presented by way of example only, and not limitation. Numerous changes to the disclosed embodiments can be made in accordance with the disclosure herein without departing from the spirit or scope of the disclosure. The breadth and scope of the present invention should not be limited by any of the above described embodiments; rather, the scope of the invention should be defined in accordance with the following claims and their equivalents.

Although embodiments been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A method of fabricating a semiconductor device comprising:
   providing a substrate having a surface comprising a first semiconductor material, the surface having formed therein a first active region and a second active region, the first active region comprising a first substantially undoped layer at the surface and a first highly doped screening layer of a first conductivity type beneath the first substantially undoped layer, and the second active region comprising a second substantially undoped layer at the surface and a second highly doped screening layer of a second conductivity type beneath the second substantially undoped layer;
   forming at least one gate dielectric layer over the surface;
   forming a layer of a first metal over the dielectric layer, the first metal having a workfunction that is substantially midgap with respect to the semiconductor material; and
   forming a gate stack having a workfunction that is substantially midgap with respect to the semiconductor material in each of the first active region and the second active region comprising the at least one gate dielectric layer and the layer of the first metal.

2. The method of claim 1, further comprising:
   prior to the forming of the layer of the first metal, providing at least one of a first capping layer for the first region and a second capping layer for the second region, wherein the first capping layer and the second capping layer are selected to adjust the workfunction of the first metal.

3. The method of claim 1, wherein the first metal is formed over a first region of the dielectric layer corresponding to the first active area, and wherein the method further comprises:
   forming a layer of a second metal over a second region of the dielectric layer corresponding the second active area, the second metal having a workfunction that is substantially midgap with respect to the semiconductor material,
   wherein the workfunction of the first metal and the workfunction of the second metal are not equal in value.

4. The method of claim 1, wherein the at least one gate dielectric layer comprises a high-K dielectric layer, and wherein the first metal comprises at least one of TiN, TaN, WN, Al, Ti, or any alloys thereof.

5. The method of claim 1, wherein the surface further has formed therein a third active region having a doping of the first conductivity type and a fourth active region having doping of the second conductivity type and having a layer of a second semiconductor material formed thereon, and wherein the method further comprises performing the steps of:
   removing a portion of the later of the first metal corresponding to the third active region;
   forming a capping layer; and
   forming a layer of a second metal over the capping layer.

6. The method of claim 1, wherein the surface further has formed therein a third active region having a doping of the first conductivity type and a fourth active region having doping of the second conductivity type and having a layer of a second semiconductor material formed thereon, and wherein the method further comprises performing the steps of:
   removing a portion of the layer of the first metal corresponding to the first active region, the second active region, and the third active region;
   forming a capping layer; and
   forming a layer of a second metal over the capping layer.

7. A semiconductor device comprising:
   a substrate having a surface comprising a semiconductor material, the surface having formed therein a first active region and a second active region, the first active region comprising a first substantially undoped layer at the surface and a first highly doped screening layer of a first conductivity type beneath the first substantially undoped layer, and the second active region comprising a second substantially undoped layer at the surface and a second highly doped screening layer of a second conductivity type beneath the second substantially undoped layer; and
   a gate stack formed in each of the first active region and the second active region, the gate stack comprising at least one gate dielectric layer over the surface and a layer of a metal over the dielectric layer, the metal having a workfunction that is substantially midgap with respect to the semiconductor material, such that each gate stack is substantially midgap with respect to the semiconductor material.

8. The semiconductor device of claim 7, wherein the workfunction for the layer of metal in the gate stack for the first active region and the workfunction for the layer of metal in the gate stack for the second active region are not equal in value.

9. The semiconductor device of claim 7, wherein at least one of the gate stack for the first active region and the gate stack for the second active region further comprises a capping layer disposed between the layer of metal and the gate dielectric layer.

10. The semiconductor device of claim 7, wherein the gate dielectric layer comprises a high-K dielectric layer and wherein the metal comprises at least one of TiN, TaN, WN, Al, Ti, or any alloys thereof.

11. A method of fabricating a semiconductor device comprising:

providing a substrate having a surface comprising a first semiconductor material, the surface having formed therein at least a first active region, a second active region, a third active region, and a fourth active region, the first active region comprising a first substantially undoped layer at the surface and a first highly doped p-type conductivity screening layer beneath the first substantially undoped layer, the second active region comprising a second substantially undoped layer at the surface and a second highly doped n-type conductivity screening layer beneath the second substantially undoped layer, the third active region comprising a doped p-type conductivity region extending from the surface, and the fourth active region comprising a second semiconductor material layer at the surface and a doped n-type conductivity region beneath the second semiconductor material layer, forming one of a first gate stack or a second gate stack in each of the first active region, the second active region, the third active region, and the fourth active region, wherein the first gate stack comprises at least one gate dielectric layer and at least one metal layer, and wherein the second gate stack comprises at least one gate dielectric layer, and at least one metal layer, wherein each of first and second gate stacks are of substantially mid-gap workfunctions.

12. The method of claim 11, further comprising selecting the first gate stack for the third active region and selecting the second gate stack for the first active region, the second active region, and the fourth active region.

13. The method of claim 12, further comprising providing a dielectric capping layer for the gate stack selected for the third active region, the dielectric capping layer comprising lanthanum.

14. The method of claim 11, wherein the at least one metal layer has a workfunction that is substantially midgap with respect to the first semiconductor material.

15. The method of claim 14, wherein the first metal comprises at least one of TiN, TaN, WN, Al, Ti, or any alloys thereof.

16. The method of claim 11, wherein the first semiconductor material comprises silicon and the second semiconductor material is an alloy comprising silicon and germanium.

17. The method of claim 11, wherein the gate dielectric layer comprises a high-K dielectric layer.

18. The method of claim 11, further comprising providing a halo implant in the third active region and the fourth active region and not in the first active region or the second active region.

* * * * *